United States Patent
Sukegawa

(10) Patent No.: US 7,366,042 B2
(45) Date of Patent: Apr. 29, 2008

(54) DEFECTIVE COLUMN(S) IN A MEMORY DEVICE/CARD IS/ARE SKIPPED WHILE SERIAL DATA PROGRAMMING IS PERFORMED

(75) Inventor: Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 11/138,521

(22) Filed: May 27, 2005

(65) Prior Publication Data

US 2005/0281089 A1    Dec. 22, 2005

(30) Foreign Application Priority Data

Jun. 21, 2004   (JP) ............................. 2004-182865

(51) Int. Cl.
*G11C 29/00* (2006.01)
*G11C 7/00* (2006.01)

(52) U.S. Cl. .................. 365/200; 365/219; 365/221

(58) Field of Classification Search ........... 365/185.09, 365/185.12, 185.17, 189.01, 189.12, 200 O, 365/219 X, 221 X, 200, 219, 221
See application file for complete search history.

(56) References Cited

U.S. PATENT DOCUMENTS 6,816,420 B1 * 11/2004 Liu et al. ................... 365/200
7,088,627 B1 *  8/2006 Bajwa et al. ............... 365/200

FOREIGN PATENT DOCUMENTS

JP     5-282880     10/1993
JP     2003-178593   6/2003

* cited by examiner

*Primary Examiner*—Van Thu Nguyen
(74) *Attorney, Agent, or Firm*—Oblon, Spivak, McClelland, Maier & Neustadt, P.C.

(57) ABSTRACT

A semiconductor device includes an interface which executes an interfacing process with a semiconductor memory, and a circuit which performs control to write serial data to the semiconductor memory while skipping a position of a defective column on the semiconductor memory.

9 Claims, 19 Drawing Sheets

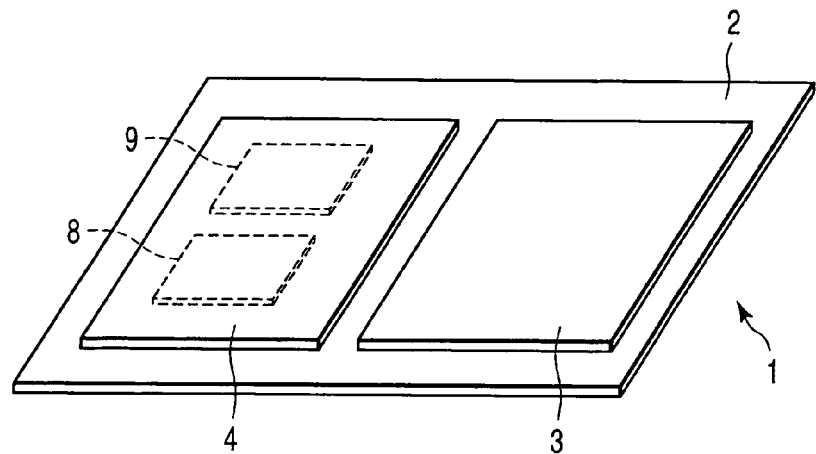
F I G. 1
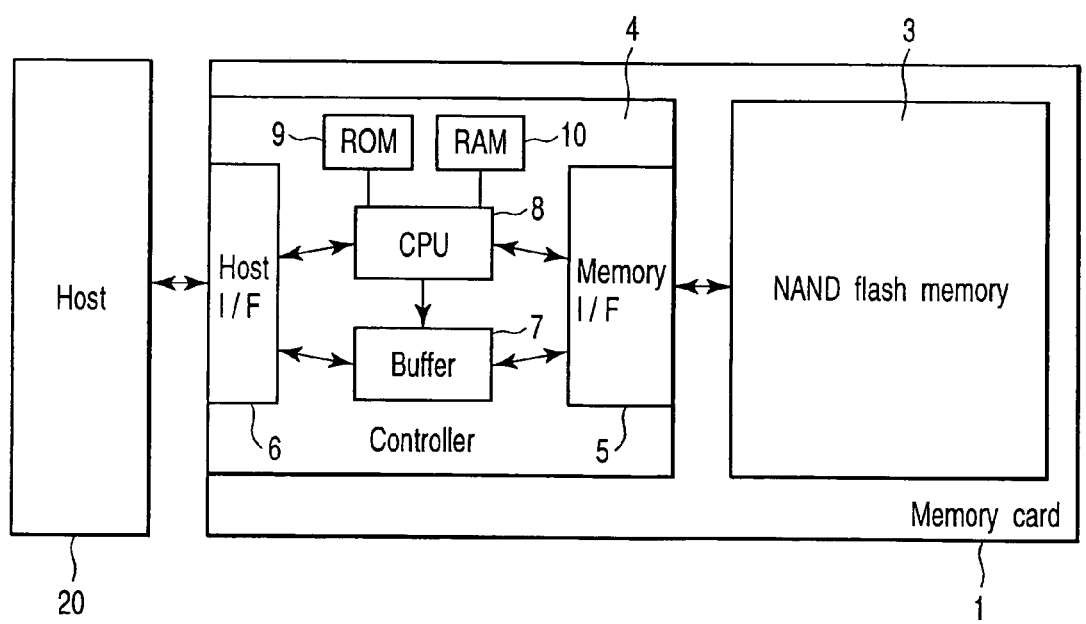
F I G. 2

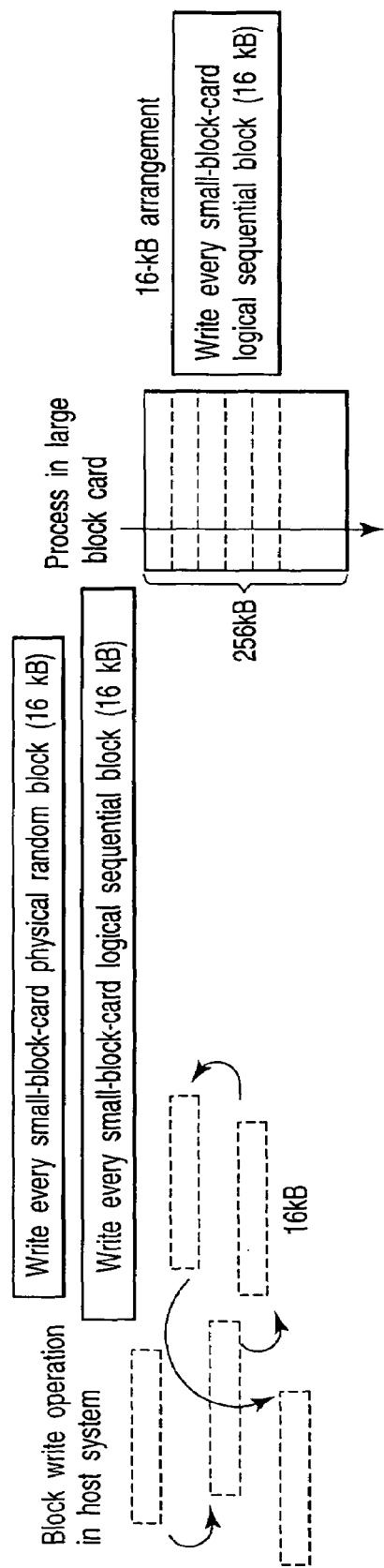
F I G. 6

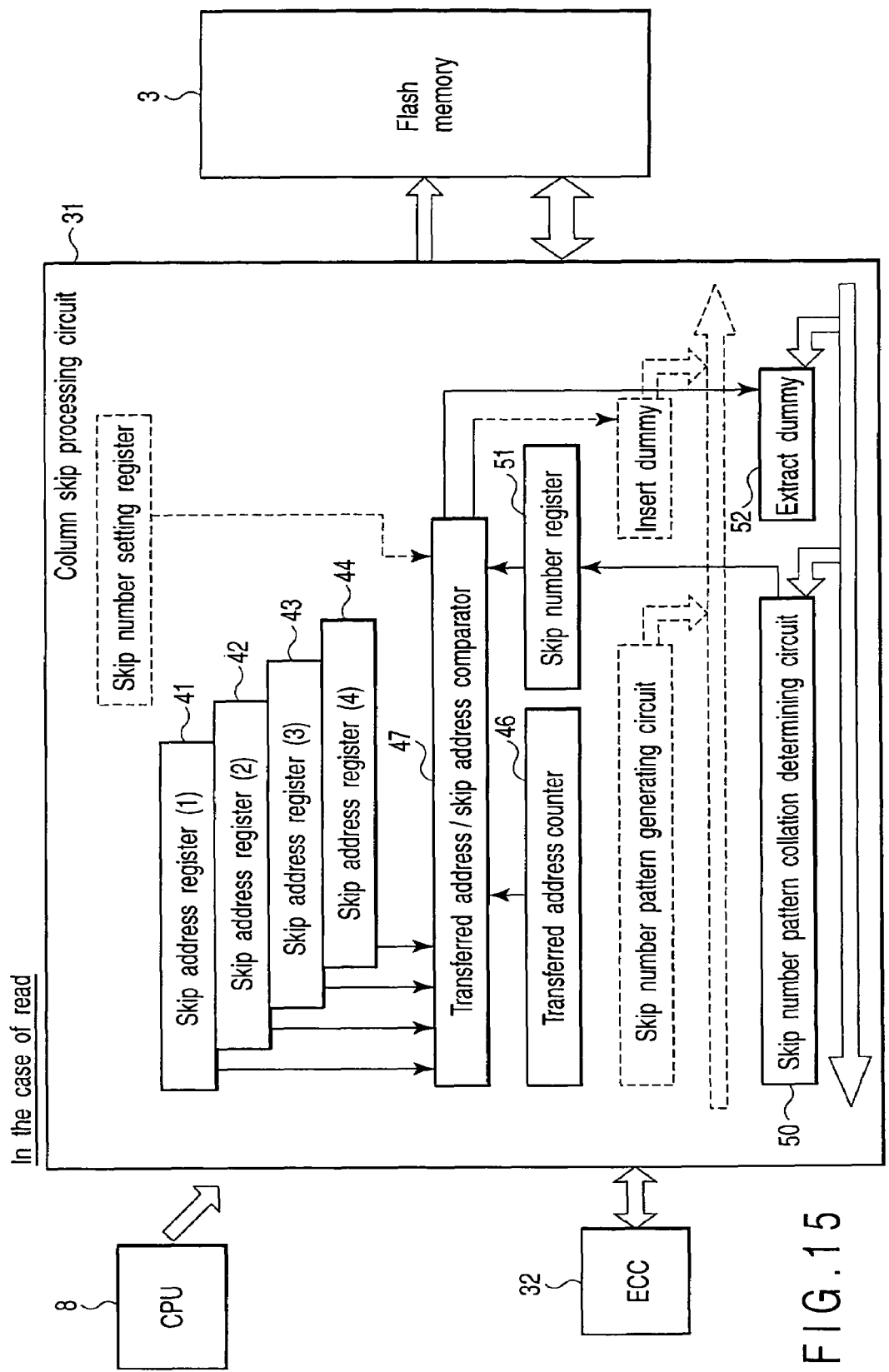
F I G. 15

DEFECTIVE COLUMN(S) IN A MEMORY DEVICE/CARD IS/ARE SKIPPED WHILE SERIAL DATA PROGRAMMING IS PERFORMED

CROSS-REFERENCE TO RELATED APPLICATIONS

This application is based upon and claims the benefit of priority from prior Japanese Patent Application No. 2004-182865, filed Jun. 21, 2004, the entire contents of which are incorporated herein by reference.

BACKGROUND OF THE INVENTION

1. Field of the Invention

The present invention relates to a memory card in which a nonvolatile semiconductor memory is mounted.

2. Description of the Related Art

In a nonvolatile semiconductor memory mounted in a memory card, defects may occur in columns. If an error caused by a column defect is detected during a data read, the data is commonly recovered by an error checking and correction (ECC) process.

Further, during a data write, data may be forcedly written even in an area containing a defective column.

Jpn. Pat. Appln. KOKAI Publication No. 2003-178593 discloses a technique to provide a column repair circuit to repair a defective column.

However, when the ECC process is executed every time an error caused by a column defect occurs during a data read, not only loads concentrate in the ECC process but it also takes a long time to read data. This may undesirably degrade the performance of the whole memory.

On the other hand, when data is forcedly written in an area containing a defective column, an error rate may increase. Further, if the target memory is a NAND flash memory or the like, the number of loop processes based on a write verify function to verify the written data may reach its upper limit value. This may also degrade the performance of the whole memory.

Furthermore, if the column repair circuit disclosed in the above document is employed, a relatively long time is required for a column repair process for the defective column. This may also degrade the performance of the whole memory.

It is thus desired to present technique of preventing the degradation of performance of a process for a column defect.

BRIEF SUMMARY OF THE INVENTION

A semiconductor device according to an embodiment of the present invention comprises a semiconductor device comprising an interface which executes an interfacing process with a semiconductor memory; and a circuit which performs control to write serial data to the semiconductor memory while skipping a position of a defective column on the semiconductor memory.

A memory card according to an embodiment of the present invention comprises a nonvolatile semiconductor memory; and a controller which performs control to write the serial data while skipping a position of a defective column on the nonvolatile semiconductor memory.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a perspective view schematically showing the configuration of a device or the like which is mounted in a memory card according to an embodiment of the present invention;

FIG. 2 is a block diagram showing a configuration including a host and the memory card;

FIG. 6 is a diagram showing a comparison of a block write operation assumed by the host with a write operation actually performed by the memory card (large block card);

FIG. 15 is a diagram illustrating a process procedure executed to read page data;

FIG. 18 is a diagram illustrating a case 1 in which a bit error occurs in a combination of bit patterns "MODEL-2";

FIG. 19 is a diagram illustrating a case 2 in which a bit error occurs in the combination of bit patterns "MODEL-2";

FIG. 21 is a diagram illustrating a case 4 in which a bit error occurs in the combination of bit patterns "MODEL-2";

DETAILED DESCRIPTION OF THE INVENTION

Figure 3:
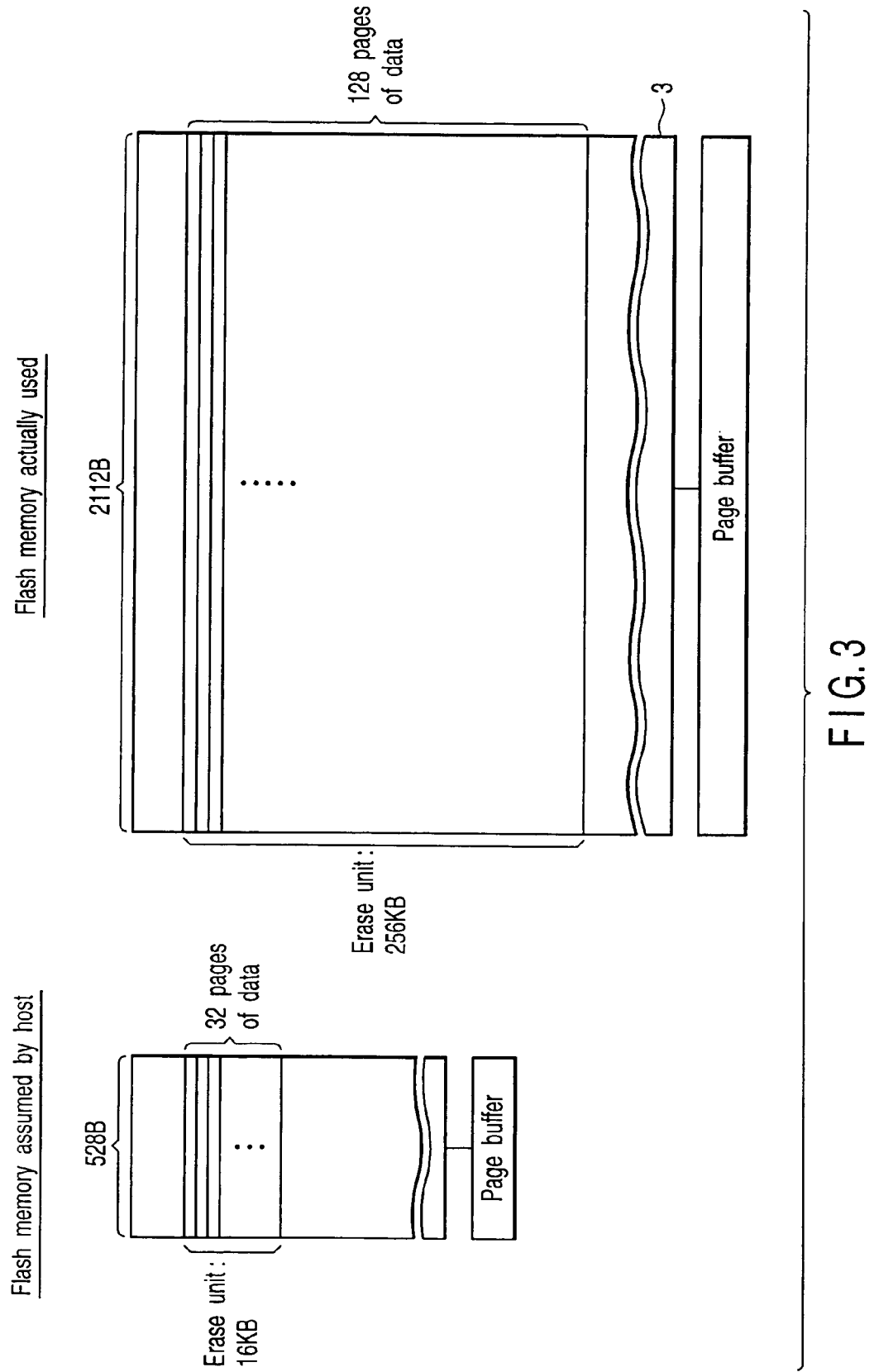
FIG. 3 is a diagram showing a difference in data arrangement between a flash memory assumed by a host system and a flash memory actually used.

Embodiments of the present invention will be described below with reference to the drawings.

FIG. 1 is a perspective view schematically showing the configuration of a device or the like which is mounted in a memory card according to an embodiment of the present invention.

As shown in this figure, the memory card 1 according to the present embodiment has a NAND flash memory 3 and a controller 4 arranged on a printed circuit board (PCB) substrate 2. Functional blocks such as a central processing unit (CPU) 8 and a read-only memory (ROM) 9 are mounted in the controller 4. Each of the devices will be described later in detail. The NAND flash memory 3 may be a binary memory in which one-bit information is stored in one memory cell or a multi-valued memory in which information containing more than one bit (for example, 2 bits) is stored in one memory cell. FIG. 1 shows that the NAND flash memory 3 and the controller 4 are arranged on the PCB. However, the NAND flash memory 3 and the controller 4 may be arranged on the same large-scale integration (LSI) circuit board.

The terms "logical block address" and "physical block address, as used herein, mean the logical address and physical address, respectively, of a block itself. Further, the "logical address" and "physical address" principally mean the logical address and physical address of a block itself but indicates that they may be addresses corresponding to a resolution unit smaller than the block unit.

FIG. 2 is a block diagram showing a configuration including a host and the memory card. Elements common to FIG. 1 are denoted by the same reference numerals.

A host apparatus (hereinafter referred to as a host) 20 comprises hardware and software (system) required to access a memory card to be connected to the host apparatus. The host 20 is constructed to manage the physical status of the interior of the memory card (which physical block address contains which logical sector address data, or from which block data has already been erased) to directly control the flash memory in the memory card.

Assuming that the NAND flash memory used has an erase block size of 16 Kbytes, the host 20 assigns every 16 Kbytes of logical and physical addresses, and in many cases, sequentially executes write or read accesses on 16 Kbytes of logical addresses (the corresponding commands are issued).

When connected to the host 20, the memory card 1 receives a power supply from the host 20 to operate. The memory card 1 then executes a process corresponding to an access from the host 2. The memory card 1 has the NAND flash memory 3 and the controller 4 as described previously.

The NAND flash memory 3 is a nonvolatile memory for which the erase block size (the block size corresponding to the erase unit) is set at 256 bytes. For example, for each write or read, 16 Kbytes of data is written in or read from the NAND flash memory 3. The NAND flash memory 3 is produced using, for example, a 0.09-μm process technique. That is, the design rule for the NAND flash memory 3 is less than 0.1 μm.

Besides the previously described CPU 8 and ROM 9, the controller 4 is provided with a memory interface section 5, a host interface section 6, a buffer 7, and a random access memory (RAM) 10.

The memory interface section 5 executes an interfacing process between the controller 4 and the NAND flash memory 3. The host interface section 6 executes an interfacing process between the controller 4 and the host 20.

When data sent by the host 20 is written in the NAND flash memory 3, the buffer 7 temporarily stores a specified amount of data (for example, one page of data). When data read from the NAND flash memory 3 is transmitted to the host 20, the buffer also temporarily stores a specified amount of data.

The CPU 8 controls operations of the whole memory card 1. When, for example, the memory card 1 receives a power supply, the CPU 8 loads firmware (a control program) stored in the ROM 9 onto the RAM 10 to execute a predetermined process. The CPU 8 thus creates various tables on the RAM 10, accesses a relevant area on the NAND flash memory 3 in response to a write, read, or erase command from the host 20, or controls a data transfer process through the buffer 7.

The ROM 9 is a memory that stores, for example, control programs used by the CPU 8. The RAM 10 is a memory used as a work area for the CPU 8 to store control programs and various tables.

FIG. 3 is a diagram showing a difference in data arrangement between a flash memory assumed by the host 20 and the flash memory actually used (that is, the NAND flash memory 3 in the memory card 1).

In the flash memory assumed by the host 20, each page has 528 bytes (512 bytes of data storage section+16 bytes of redundant section), and 32 pages correspond to one erase unit (that is, 16 Kbytes+0.5 Kbytes (in this case, K is 1,024)). A card in which such a flash memory is mounted will hereinafter sometimes be referred to as a "small block card".

On the other hand, in the flash memory 3 actually used, each page has 2,112 bytes (512 bytes of data storage section ×4+10 bytes of redundant section ×4+24 bytes of management data storage section), and 128 pages correspond to one erase unit (that is, 256 Kbytes+8 Kbytes). A card in which such a flash memory is mounted may hereinafter be referred to as a "large block card". For convenience, the erase unit for the small block card will hereinafter be referred to as 16 Kbytes. The erase unit for the large block card will hereinafter be referred to as 256 Kbytes.

Each of the flash memory assumed by the host 20 and the flash memory 3 actually used comprises a page buffer required to receive or output data from or to the flash memory. The page buffer provided in the flash memory assumed by the host 20 has a storage capacity of 528 bytes (512 bytes and 16 bytes). On the other hand, the page buffer provided in the flash memory actually used has a storage capacity of 2,112 bytes (2,048 bytes and 64 bytes). For each data write or the like, each page buffer receives or outputs one page of data from or to the flash memory, the page corresponding to its storage capacity.

In the example shown in FIG. 3, the flash memory 3 actually used has an erase block size 16 times as large as that of the flash memory assumed by the host 20. However, the present invention is not limited to this aspect. Another configuration is possible provided that the erase block size of the flash memory 3 actually used is substantially an integral multiple of that of the flash memory assumed by the host 20.

To make the large block card a product that is effective in a practical sense, the flash memory 3, shown in FIG. 3, desirably has a storage capacity of 1 Gbits or more. If the flash memory 3 has a storage memory of, for example, 1 Gbits, there are 512 256-Kbyte blocks (erase unit).

FIG. 3 illustrates that the erase unit is a 256-Kbyte block. However, it is also effective in a practical sense to configure the flash memory so that the erase unit is, for example, 128 Kbytes. In this case, there are 1,024 128-Kbyte blocks.

FIG. 3 also shows that the erase block size of the flash memory 3 actually used is larger than that of the flash memory assumed by the host 20. However, the present invention is not limited to this aspect, the flash memory may be configured so that the flash memory 3 actually used has a smaller erase block size than the flash memory assumed by the host 20.

Figure 4:
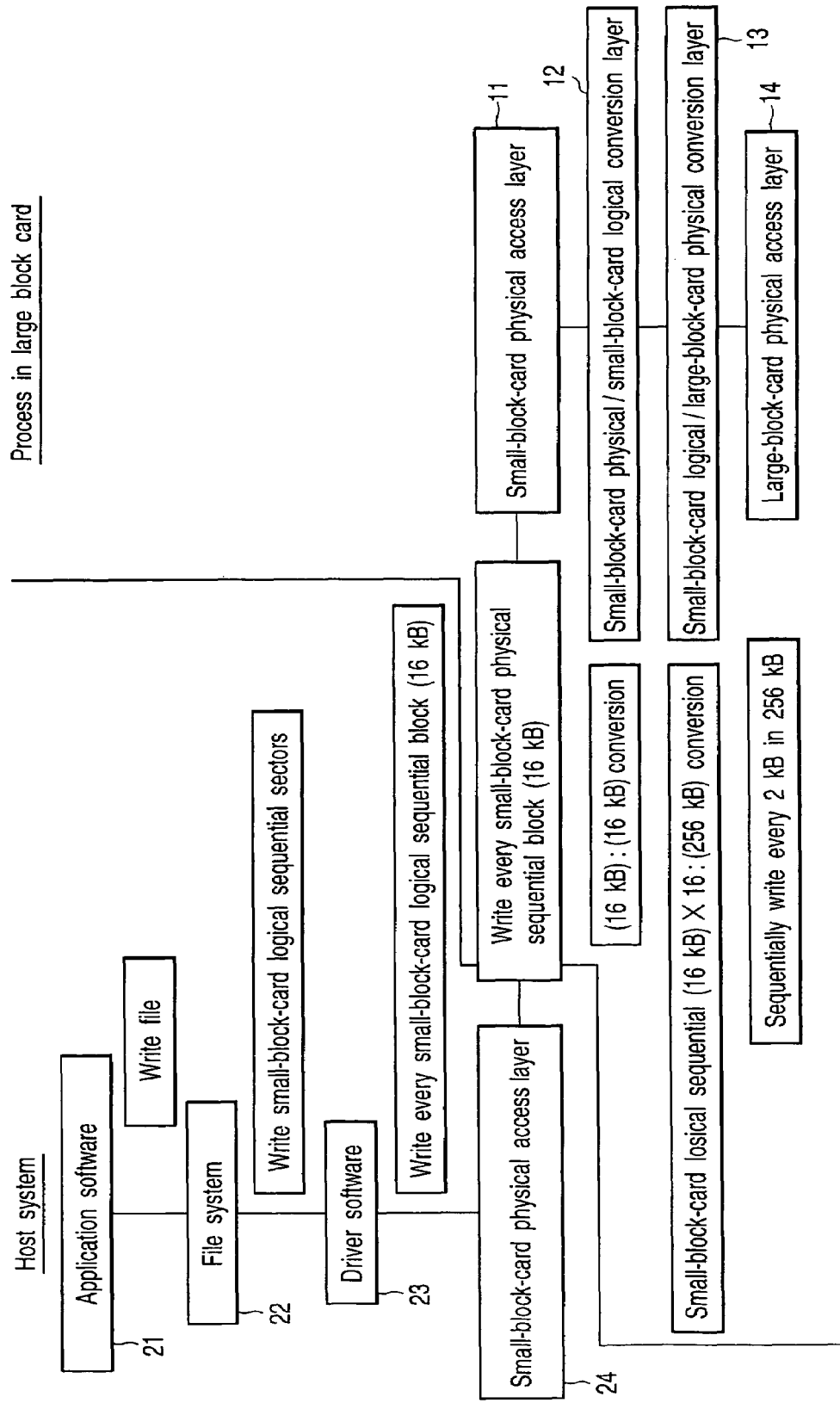
FIG. 4 is a chart showing the communication hierarchy of the host system and of the memory card (large block card)

FIG. 4 is a chart showing the communication hierarchy of the host system and of the memory card (large block card).

The host 20 system has application software 21, a file system 22, driver software 23, and a small-block-card physical access layer 24. On the other hand, the memory card 1 (large block card) has a small-block-card physical access layer 11, a small-block-card physical/small-block-card logical conversion layer 12, a small-block-card logical/large-block-card physical conversion layer 13, and a large-card-block physical access layer 14.

For example, the application software 21 in the host 20 requests the file system 22 to write a file in the memory. Then, the file system 22 instructs the driver software 23 on sequential sector writes on the basis of logical block addresses in the small block card. Upon receiving the instruction, the driver software 23 carries out logical/physical block conversions in order to sequentially write data, that is, one 16-Kbyte block at a time, on the basis of logical block addresses of the small block card. The driver software 23 then issues a random write command based on physical block addresses of the small block card, to the large block card through the small-block-card physical access layer 24. The driver software 23 then executes a data transfer.

For both small and large block cards, a write access is premised on the transmission of a (1) command, a (2) page address (row address), a (3) column address, (4) data, and a (5) program confirmation command in this order in accordance with an appropriate protocol.

Upon receiving a write command with logical block addresses of the small block card from the host 20, the small-block-card physical access layer 11 in the large block card acquires not only the physical block addresses and data but also logical block addresses contained in accompanying data.

The small-block-card physical/small-block-card logical conversion layer 12 has a first table used for a data read or the like to convert physical block addresses (each corresponding to 16-Kbyte block) of the small block card into logical block addresses (each corresponding to 16-Kbyte block) of the small block card. When the small-block-card physical access layer 11 receives a write command to acquire logical block addresses of the small block card, the conversion layer 12 reflects the logical block addresses in the first table. The conversion layer 12 also reflects physical block addresses in the first table.

The small-block-card logical/large-block-card physical conversion layer 13 has a second table used for a data read or the like to convert logical block addresses (each corresponding to sequential 16-Kbyte block×16) of the small block card into physical block addresses (each corresponding to 256-Kbyte physical block) of the large block card. When the small-block-card physical access layer 11 receives a write command to acquire logical block addresses of the small block card, the conversion layer 12 reflects the logical block addresses in the second table.

On the basis of the logical block addresses acquired by the small-block-card physical access layer 11 upon receiving the write command, the large-block-card physical access layer 14 determines how the data is arranged inside the flash memory 3. The large-block-card physical access layer 14 then sequentially writes 16 Kbytes of data in a 256-Kbyte physical block the memory by writing 2 Kbytes (one page) of data during each operation. The large-block-card physical access layer 14 stores the logical and physical block addresses of the small block card which have been acquired, in a predetermined area within a managed data area inside the flash memory 3.

The host 20 thus issues a command based on physical block addresses of the small block card. Accordingly, the large block card carries out management so as to make it possible to determine which 256-Kbyte physical block contains data corresponding to certain physical block addresses of the small block card. Specifically, the large block card manages the correspondences between logical block addresses and physical block addresses for every 16-Kbyte block. The large block card also carries out management so as to make it possible to determine which 256-Kbyte physical block in the large block card contains data corresponding to a 256-Kbyte block of consecutive logical block addresses of the small block card.

Figure 5:
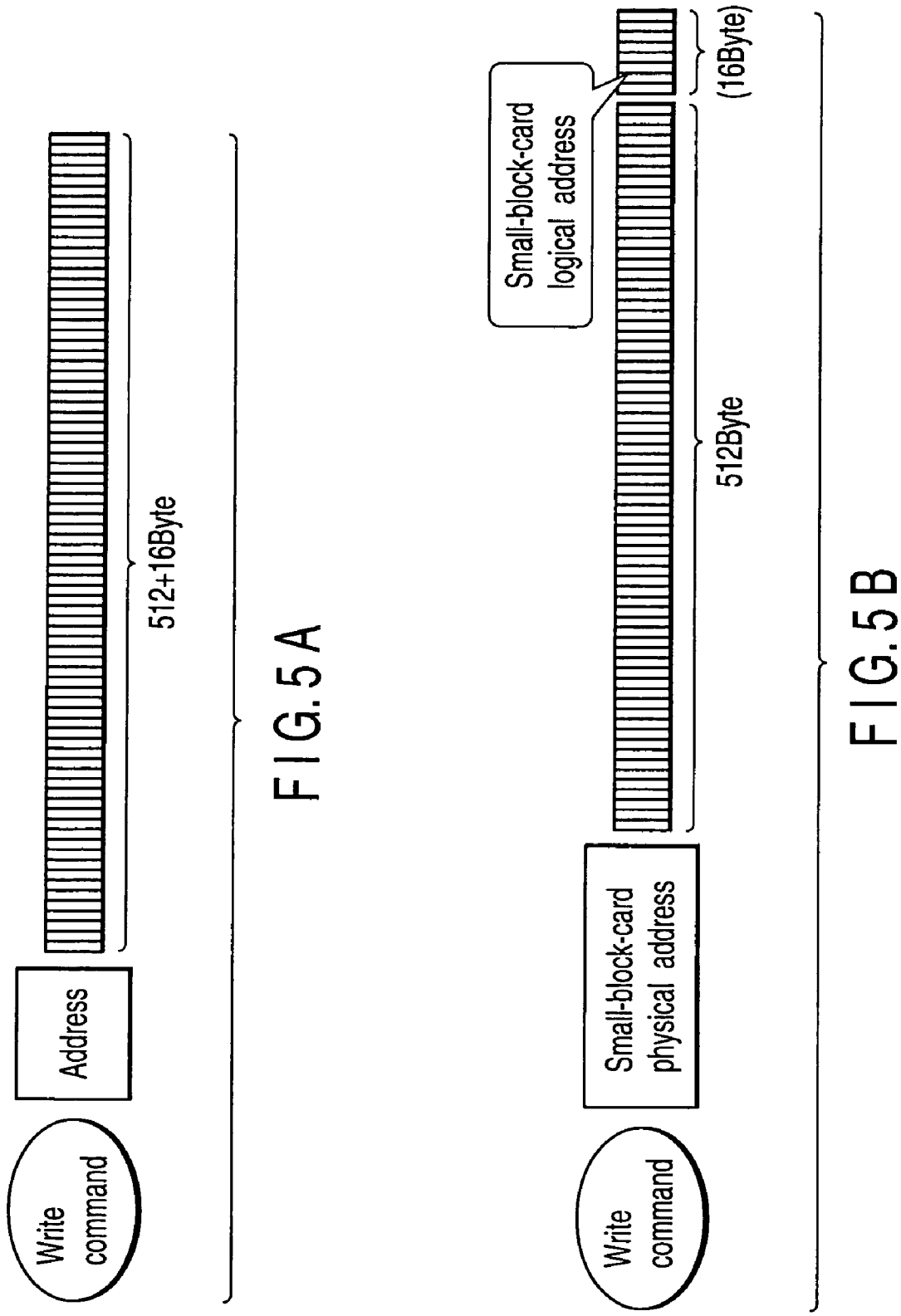
FIGS. 5A and 5B are diagrams showing the format of a command sent by the host.

FIGS. 5A and 5B are diagrams showing the format of a command sent by the host 20.

A packet for a command sent by the host 20 contains various pieces of information such as command type information (in this case, "write"), addresses (physical block addresses), and data (actual data such as contents and accompanying data (512 bytes+16 bytes)) as shown in FIG. 5A.

In a packet in this format, "logical block addresses" (logical addresses corresponding to a 16-byte block to be accessed) of the small block card are arranged at a predetermined location in the accompanying data as shown in FIG. 5B. The large block card acquires not only the command type information, physical block addresses, and data but also the "logical block addresses". The "logical block addresses" are not added for a read command.

FIG. 6 is a diagram showing a comparison of a block write operation assumed by the host with a write operation actually performed by the memory card 1 (large block card).

When a sequential write operation in 16-Kbyte blocks is performed on the basis of logical addresses of the small block card, the host 20 (the left of the figure) performs a random write operation in 16-Kbyte blocks on the basis of physical block addresses of the small block card.

On the other hand, upon receiving a write command from the host 20, the large block card (the right of the figure) sequentially writes every 16 Kbytes of data in the flash memory 3 on the basis of logical block addresses of the small block card.

As previously described, the host 20 performs a random write operation in 16 Kbytes on the basis of physical addresses for small blocks. Such a random write operation involves many processes of rewriting only a part of a large block (256 Kbytes). The NAND flash memory only allows data to be erased in block units. Accordingly, if a block is partly rewritten, it is necessary to write new data to replace the corresponding part of old data, in a new block from which data has already been erased and then copy the remaining data which is not to be rewritten, from the old block containing the old data to be replaced with the new data, to the new block. In this manner, the process of rewriting only a part of a block involves an operation of copying data that is not to be rewritten (this operation will hereinafter be referred to as a "mixed-up data copy"). Consequently, many processes of rewriting only a part of a block may result in a significant increase in overhead. Thus, in the present embodiment, the large block card reassigns the physical addresses in accordance with the order of the logical addresses obtained from the host 20. This reduces the occurrence of writes to only a part of a block to suppress an increase in overhead.

Figure 7:
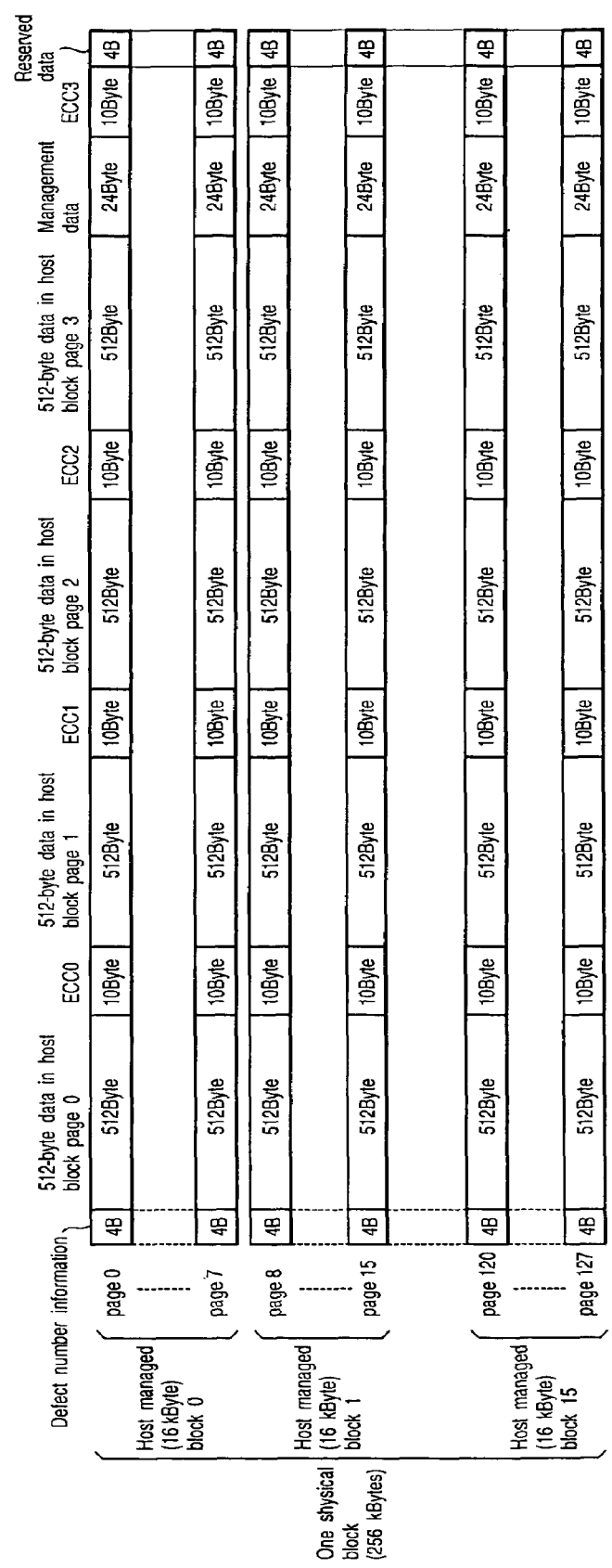
FIG. 7 is a diagram showing the block format of the flash memory in the large block card (for a 256-Kbyte physical block corresponding to an erase unit)

FIG. 7 is a diagram showing the block format of the NAND flash memory 3 in the large block card (for a 256-Kbyte physical block corresponding to an erase unit).

In the large block card, a 256-Kbyte physical block corresponding to an erase unit contains 16 blocks in which data corresponding to 16 Kbytes, corresponding to a unit managed by the host 20, is written (these blocks will hereinafter be referred to as host managed blocks). For a data write, individual data are arranged in the order of the logical block addresses of the small block card.

Each host managed block includes eight pages. Each page contains four 512-byte data areas and 10-byte ECC areas each corresponding to one data area. Further, a 24-byte managed data area is provided after the last (fourth) 512-byte data area in a page. Thus, the last 10-byte ECC area in the page corresponds to both fourth 512-byte data area and 24-byte managed data area.

Moreover, the head of each page has an area for 4-byte defect number information indicative of the number (for example, any of 0 to 4) of defective columns within that page.

Also, the last of each page has a 4-byte reserved area. This reserved area is prepared for the case where one or more defect columns occur on the corresponding page. In the case where a defective column exists, 1-byte particular data as a dummy is written in the defective column and the area for succeeding data to be written is shifted backward. As a result, the reserved area is exhausted and shortened by the shifted amount. FIG. 7 shows an example in which the particular data as a dummy is not yet written and the reserved area is not exhausted.

Moreover, for example, the last of 128 24-byte managed data areas contained in a 256-byte physical block corresponding to the erase unit stores both address information corresponding to physical block addresses acquired from a command sent by the host 20 (this information will hereinafter referred to as "host managed physical addresses) and address information corresponding to logical block addresses acquired from the command sent by the host 20 (this information will hereinafter referred to as "host managed logical addresses).

The "host managed physical addresses" and "host managed logical block addresses" stored in each 256-Kbyte block are used to create the first table possessed by the small-block-card physical/small-block-card logical conversion layer 12 and the second table possessed by the small-block-card logical/large-block-card physical conversion layer 13 as described in FIG. 4.

Figure 8:
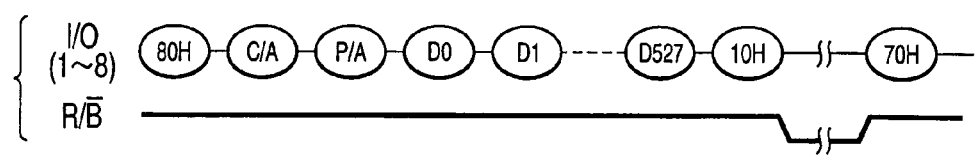
FIG. 8 is a timing chart showing an example of signals to an I/O and R/B pins of the memory card which signals are used when the host executes writes on the memory card according to the present embodiment.

FIG. 8 is a timing chart showing an example of signals to I/O and R/B pins of the memory card which signals are used when the host 20 executes writes on the memory card 1 according to the present embodiment.

The host 20 controls a memory card assuming that the memory card is a nonvolatile memory having a 16-Kbyte erase block size. For example, for a write in the memory card, the host 20 inputs a serial data input command 80H (H denotes a hexadecimal number) to I/O pins 1 to 8. Then, the host 20 inputs a column address C/A and a page address P/A to the I/O pins 1 to 8. The column address C/A and the page address P/A are provided for a virtual physical address space assumed by the host 20 for the memory card 1.

Moreover, the host 20 inputs write data to each of the I/O pins 1 to 8 528 times. Specifically, the host 20 sequentially shifts 528 bits (a total value for all the I/O pins) of data in each of the I/O pins while clocking an input signal to the write enable pin 528 times. Once the data shift-in has been completed, the host 20 inputs a program command 10H to the input pins 1 to 8. In response to this, the memory card outputs a low-level signal to the R/B pin to indicate that the memory card is busy. A predetermined time later, the memory card outputs a high-level signal to the R/B pin to indicate that the memory card is ready.

However, the status of the R/B pin in FIG. 8 only indicates the status of the memory card 1 to the host 20. That is, in FIG. 8, even when the R/B pin indicates a busy status (that is, outputs a low level) in response to the input of the program command 10H, this does not always indicate that an internal write operation (that is, transfer of data from the page buffer to a memory cell array) is actually being performed on the NAND flash memory 3. Even if the R/B pin returns to the ready status, this does not always indicate that an internal write operation on the NAND flash memory 3 has actually been completed.

Figure 9:
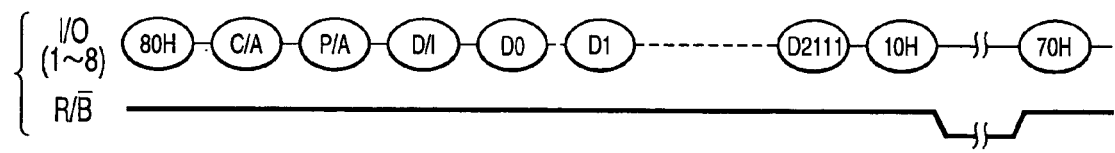
FIG. 9 is a timing chart showing an example of signals for the I/O and R/B pins of a nonvolatile memory in the memory card which signals are used when a controller in the memory card executes writes on the nonvolatile memory in the memory card according to the present embodiment.

FIG. 9 is a timing chart showing an example of signals to the I/O and R/B pins of the NAND flash memory 3 which signals are used when the controller 4 in the memory card 1 executes writes on the NAND flash memory 3 in the memory card 1 according to the present embodiment.

The controller 4 recognizes that the NAND flash memory 3 is nonvolatile and has a 256-Kbyte erase block size. For example, for a write in the NAND flash memory 3, the controller 4 inputs the serial data input command 80H (H denotes a hexadecimal number) to I/O pins 1 to 8. Then, the controller 4 inputs the column address C/A and the page address P/A to the I/O pins 1 to 8. The column address C/A and the page address P/A are provided for a real physical address space assumed by the controller 4 for the NAND flash memory 3. Accordingly, these addresses do not necessarily match the column address C/A and page address P/A in FIG. 8.

In the present embodiment, after inputting the page address P/A, the controller 4 inputs 4-byte defect number information (hereinafter referred to as "D/T") indicative of the number (0 to 4) of defective columns on the page, to the I/O pins.

Moreover, the controller 4 inputs write data to each of the I/O pins 1 to 8 2,112 times. Specifically, the controller 4 sequentially shifts 2,112 bits (a total value for all the I/O pins) of data through the I/O pins while clocking an input signal to the write enable pin 2,112 times. FIG. 9 illustrates that no defective columns are present on the page on which a write is to be executed. If any defective column is present, particular data operating as a dummy is inserted into a corresponding position in data D0 to D2111.

Once the data shift-in has been completed, the controller 4 inputs the program command 10H to the input pins 1 to 8. In response to this, the memory card outputs a low-level signal to the R/B pin to indicate that the memory card is busy. A predetermined time later, the memory card outputs a high-level signal to the R/B pin to indicate that the memory card is ready. The status of the R/B pin in FIG. 9 indicates the actual status of the NAND flash memory 3 to the controller 4.

In FIGS. 8 and 9, described above, each of the inputs of the column address C/A and page address P/A is shown completed in one cycle. However, the input may require two or more cycles depending on the capacity of the memory card 1 or NAND flash memory 3.

Figure 10:
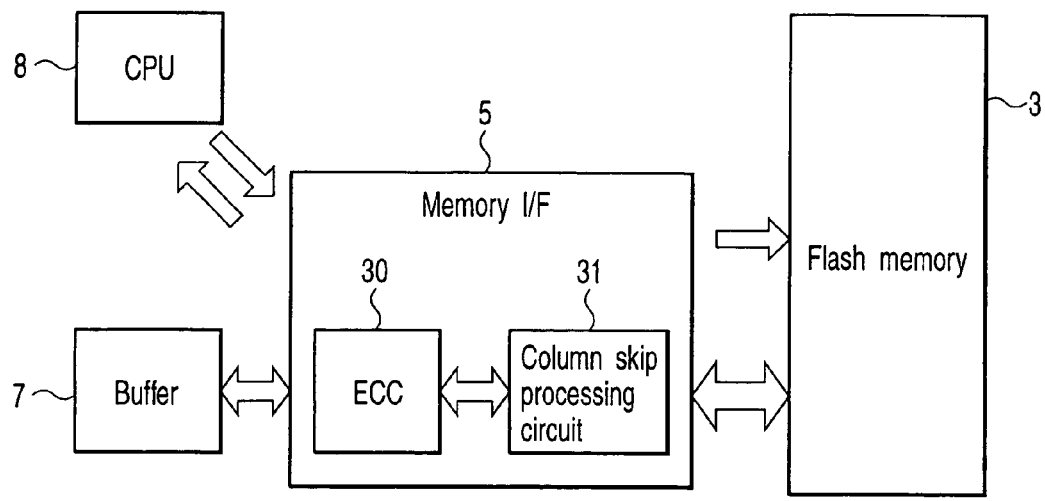
FIG. 10 is a diagram schematically showing the configuration of main sections around a memory interface section shown in FIG. 2.

FIG. 10 is a diagram schematically showing the configuration of main sections around the memory interface section 5, shown in FIG. 2.

As shown in the figure, the memory interface section 5 comprises an ECC processing circuit 30 and a column skip processing circuit 31. Data transfers between the flash memory and the buffer 7 are carried out through the ECC processing circuit 30 and the column skip processing circuit 31.

The ECC processing circuit 30 checks, for example, data read from the flash memory 3 for an error. If any error is detected, the ECC processing circuit 30 corrects it.

For each page, if there is any defective column on the flash memory 3, the column skip processing circuit 31 skips the position of the defective column before writing serial data. Every time a defect is newly detected, the CPU 8, executing the firmware, informs the column skip processing circuit 31 of the number of defective columns within the page to be skipped and column addresses (skip addresses) corresponding to the positions of the defective columns to be skipped. For easier understanding of the contents of the present embodiment, the description below focuses on a write and read of serial data for one page (this serial data will hereinafter be referred to as "page data").

In writing page data, the column skip processing circuit 31 adds, to the head of the page data, defective number information indicative of the number (for example, any of 0 to 4) of defective columns within a page (2,112 bytes (2,048 bytes+64 bytes)) in which the page data is to be written. The column skip processing circuit 31 further inserts particular data operating as a dummy (this data will hereinafter be referred to as "dummy data") into the position in the page data which corresponds to the defective column (corresponds to the skip address). The column skip processing circuit 31 then transfers the page data to the flash memory 3. For example, "FF" data is employed as dummy data. This prevents "0" from being written in the defective column, thus enabling the defective column to be excluded from write verification targets. The dummy data is not limited to the "FF" data. Another data may be used provided that it can be excluded from the write verification targets.

In reading page data, the column skip processing circuit 31 extracts the defective number information from the page data, the defective number information having been added to the page data read from the flash memory 3. With reference to the defect number information, the column skip processing circuit 31 further extracts dummy data the number of which is shown in the defect number information and which have been inserted into the page data. The column skip processing circuit 31 then transfers the page data to the host. The defect number information is referenced because the number of defects must be determined after a write has been executed on the page data and because the original page data can be correctly reproduced only when all the dummy data inserted into the page data are extracted from the page data (for example, if there are two defects after a write has been executed on the page data and the number of defects increases to three before a read is executed and if three extracting operations are performed on the page data, data that need not be extracted is extracted).

Figure 11A:
FIGS. 11A to 11C show diagrams showing examples of the formats of page data processed by a column skip processing circuit during a write.
Figure 11B:
Figure 11C:
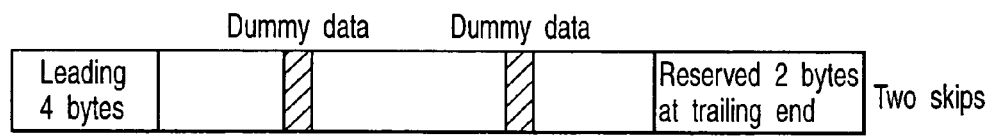

FIGS. 11A to 11C are diagrams showing an example of the format of page data processed by the column skip processing circuit 31 for a write.

FIG. 11A shows the format in which there are no defective columns. In this case, the head (4 bytes) of the format has defect number information indicating that there are no defective columns. Since there are no defective columns to be skipped, no dummy data is inserted.

FIG. 11B shows the format in which there is one defective column. In this case, the head (4 bytes) of the format has defect number information indicating that there is one defective column. Dummy data is inserted into the position corresponding to the defective column. The remaining part of the page data is shifted backward by an amount corresponding to the inserted dummy data. As a result, the reserved area, located at a trailing end of the format, is shortened.

FIG. 11C shows the format in which there are two defective columns. In this case, the head (4 bytes) of the format has defect number information indicating that there are two defective columns. First dummy data is inserted into the position corresponding to the first defective column. Second dummy data is inserted into the position corresponding to the second defective column. The remaining part of the page data is shifted backward by an amount corresponding to the inserted dummy data. As a result, the reserved area, located at the trailing end of the format, is shortened.

Figure 12:
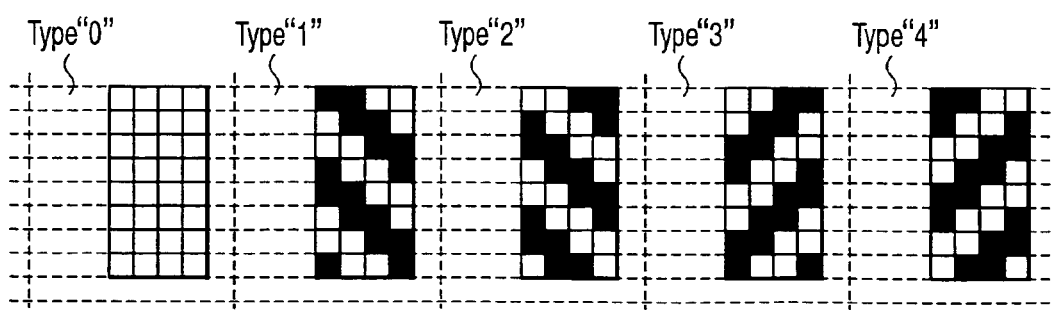
FIG. 12 is a diagram showing a specific example of defect number information shown in FIGS. 11A to 11C.

FIG. 12 is a diagram showing a specific example of the defect number information shown in FIGS. 11A to 11C.

The column skip processing circuit 31 has plural types of bit patterns corresponding to the number of defective columns as defect number information. In the present embodiment, five types of bit patterns Type "0", Type "1", Type "2", Type "3", and Type "4" are used. The number lying to the right of the word Type indicates the number of defective columns.

Each bit pattern is made up of a plurality of (32) bits. Even if errors occur in a certain number of these bits, each bit pattern can be distinguished from the other bit patterns (in the figure, each white square indicates the value "1", whereas each black square indicates the value "0"). In the illustrated example, a checkered pattern is employed for the bit patterns Type "1" to Type "4". In the respective bit patterns, the stripes have different directions or the white and black are reversed. This makes it possible to reliably determine the type of the bit pattern even if a certain number of bit errors occur.

A comparison of any two of the above five types of bit patterns shows that at least 8 bits have a different value between these bit patterns. In other words, the bit patterns are set so that at least 8 bits (one-fourth of the total number of bits) of the 32 bits of each bit pattern have a different value between the bit patterns.

A detailed description will be given later of the reason why the illustrated combination of bit patterns is excellent and variations of the combination.

Figure 13:
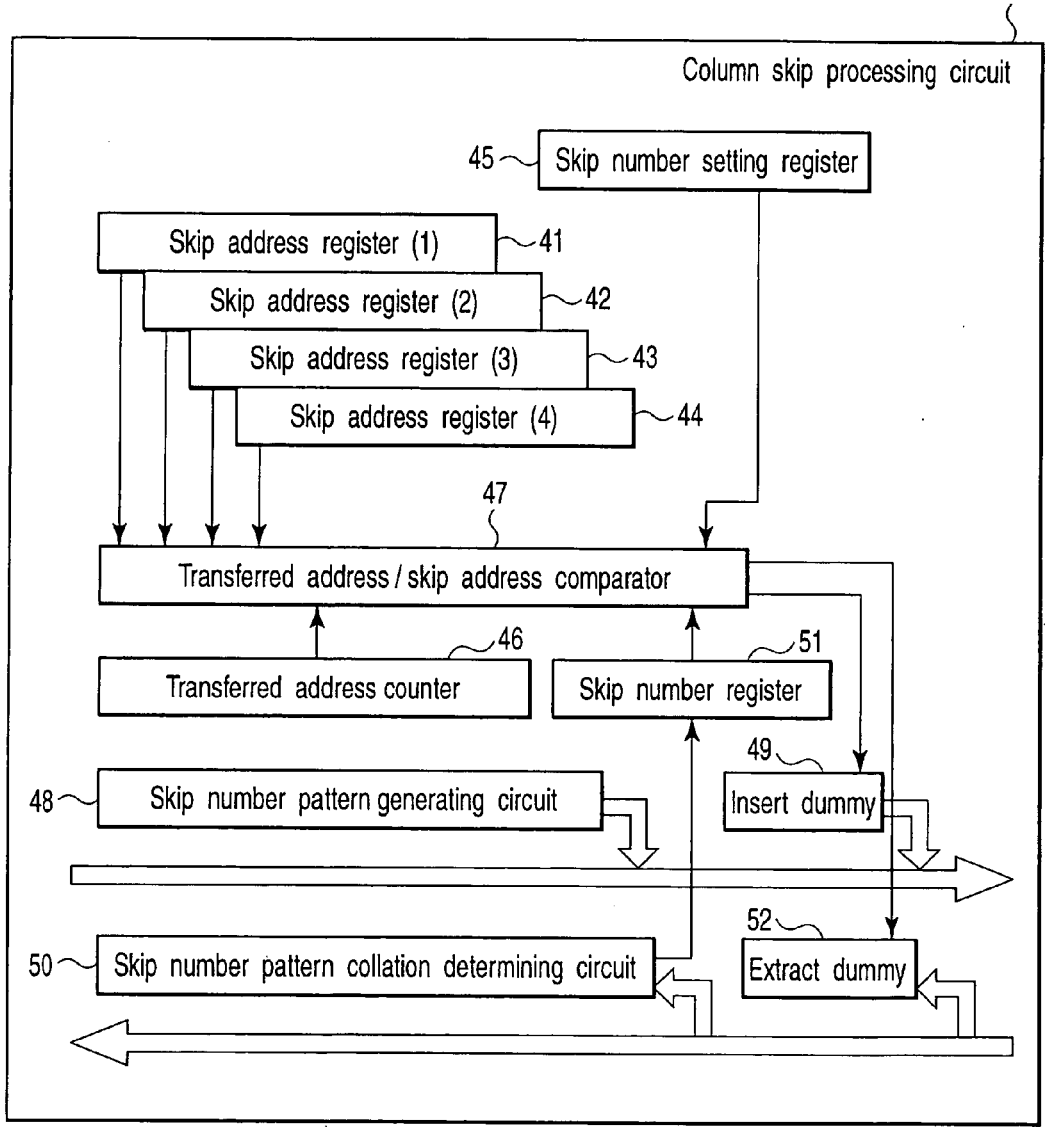
FIG. 13 is a block diagram showing the internal configuration of a column skip processing circuit shown in FIG. 10.

FIG. 13 is a block diagram showing the internal configuration of the column skip processing circuit 31, shown in FIG. 10. The description will focus on a process corresponding to an arbitrary page on the flash memory 3.

The column skip processing circuit 31 has a first skip address register 41, a second skip address register 42, a third skip address register 43, a fourth skip address register 44, skip number setting register 45, a transfer address counter 46, a transfer address and skip address comparator 47, a skip number pattern generating circuit 48, a dummy inserting section 49, a skip number pattern collation determining circuit 50, a skip number register 51, a dummy extracting section 52, and the like as shown in the figure.

The first to fourth skip address registers 41 to 44 store column addresses (skip addresses) corresponding to the positions of defective columns in the page to be skipped. The first to fourth skip address registers 41 to 44 are set by the CPU 8 (a write process), which executes the firmware. The first skip address register 41 stores a first skip address in the page. The second skip address register 42 stores a second skip address in the page. The third skip address register 43 stores a third skip address in the page. The fourth skip address register 44 stores a fourth skip address in the page.

The skip number register 45 stores the number of defective columns in the page to be skipped (skip number). The skip number setting register 45 is set by the CPU 8 (a write process), which executes the firmware.

The transfer address counter 46 is used in writing page data transferred by the host, in the flash memory 3 and transferring page data read from the flash memory 3, to the host. In connection with page data transferred between the host and the flash memory 3, the transfer address counter 46 counts the corresponding column address (transfer address) starting with the head of the page data.

The transfer address and skip address comparator 47 is used in writing page data transferred by the host, in the flash memory 3 and transferring page data read from the flash memory 3, to the host. In writing the page data, the comparator 47 uses skip address registers the number of which is the same as the number of skips stored in the skip number setting register 45. For example, if the number of skips is four, the skip address stored in the first skip address register 41 is first referenced. Subsequently, references are made to the corresponding skip addresses stored in the second skip address register 42, the third skip address register 43, and the fourth skip address register 44 in this order. If the number of skips is at least 1, the comparator 47 sequentially compares the transfer address counted by the transfer address counter 46 with the individual skip addresses stored in the respective skip address registers. Every time a match occurs, an instruction on insertion of dummy data is transmitted to the dummy inserting section 49.

On the other hand, in reading page data, the comparator 47 uses skip address registers the number of which is the same as the number of skips stored in the skip number register 51 (described later). The order of references to the skip addresses is the same as that for a page data write. If the number of skips is at least 1, the comparator 47 sequentially compares the transfer address counted by the transfer address counter 46 with the individual skip addresses stored in the respective skip address registers. Every time a match occurs, an instruction on extraction of dummy data is transmitted to the dummy extracting section 52.

The skip number generating circuit 48 is used in writing page data transferred by the host, in the flash memory 3. The circuit 48 generates, as defect number information, one Type "n" of the five types of bit patterns Type "0", Type "1", Type "2", Type "3", and Type "4", shown in FIG. 12, which corresponds to the skip number n set in the skip number setting register 45. The circuit 48 then adds the bit pattern Type "n" to the head of the page data.

The dummy inserting section 49 is used in writing page data transferred by the host, in the flash memory 3. Upon receiving an instruction from the transfer address and skip address comparator 47, the dummy inserting section 49 inserts dummy data into the page data.

The skip number pattern collation determining circuit 50 is used in transferring page data read from the flash memory 3, to the host. The circuit 50 extracts the bit pattern added to the head of the page data read from the flash memory 3 as defect number information. The circuit 50 then determines through collation to which of Type "0", Type "1", Type "2", Type "3", and Type "4" this bit pattern corresponds. The circuit 50 also writes the number of skips corresponding to the determined type of the bit pattern, in the skip number register 51.

The skip number register 51 is used in transferring page data read from the flash memory 3, to the host. The skip number register 51 stores the number of skips set by the skip number pattern collation determining circuit 50. The skip number register 51 is used by the transfer address and skip address comparator 47.

The dummy extracting section 52 is used in transferring page data read from the flash memory 3, to the host. Upon receiving an instruction from the transfer address and skip address comparator 47, the dummy extracting section 52 extracts dummy data from the page data.

Figure 14:
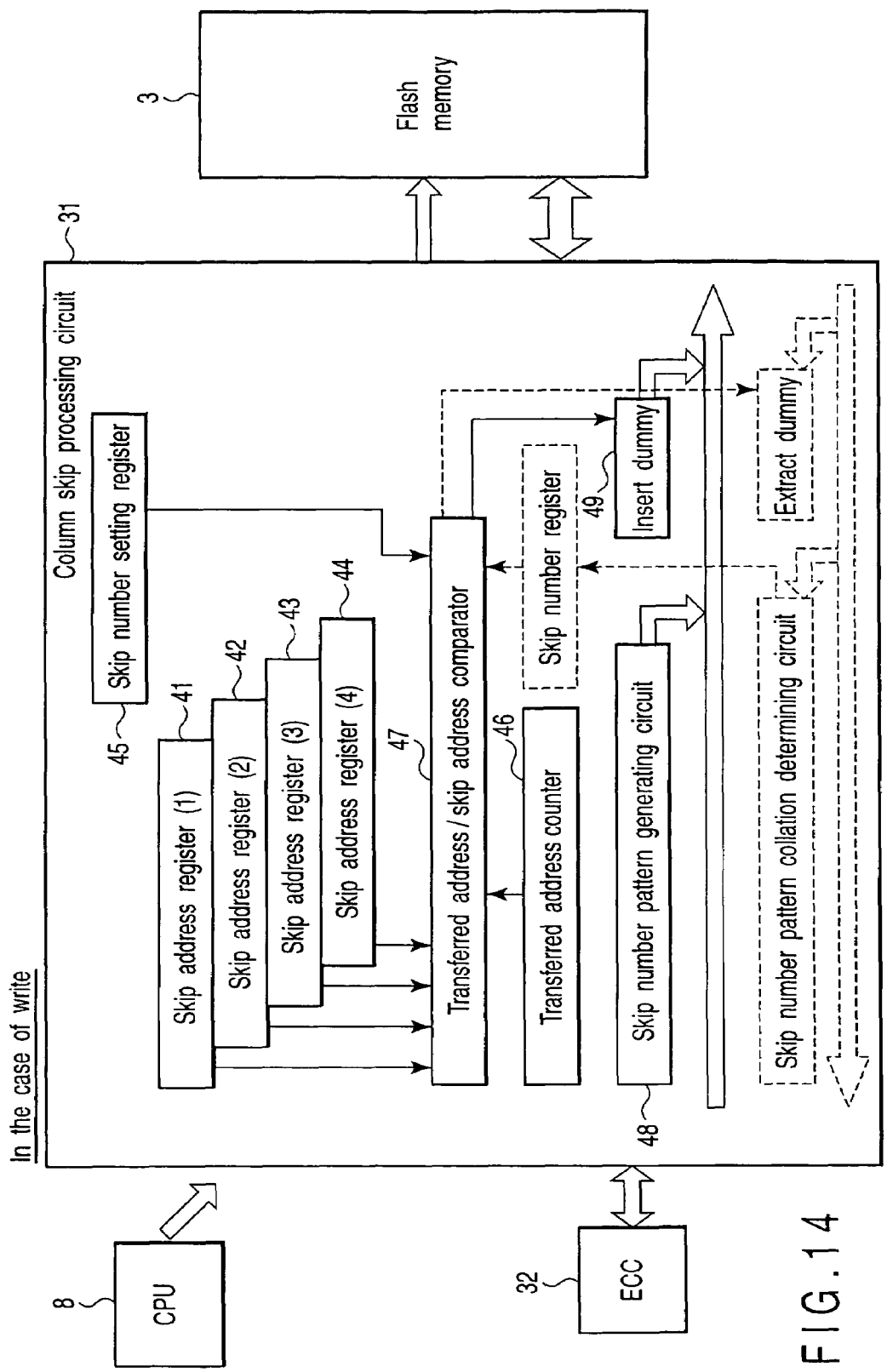
FIG. 14 is a diagram illustrating a process procedure executed to write page data.

Now, with reference to FIG. 14, description will be given of a process procedure used to write page data.

Every time a column defect occurs, the CPU 8, which executes the firmware, sequentially sets the column address (skip address) corresponding to the position of the defective column to be skipped, starting with the first skip address register 41. Further, the number of defective columns (skips) is set in the skip number setting register 45.

When page data is transferred by the host via the ECC processing circuit 30, the skip number pattern generating circuit 48 generates, as defective number information, one Type "n" of the plurality of bit patterns Type "0", Type "1", Type "2", Type "3", and Type "4", which corresponds to the skip number n set in the skip number setting register 45. The circuit 48 then adds the bit pattern Type "n" to the head of the page data.

In connection with the page data transferred by the host, the transfer address counter 46 counts the corresponding column address (transfer address) starting with the head of the page data.

If the number of skips set in the skip number setting register 45 is at least 1, the transfer address and skip address comparator 47 uses skip address registers the number of which is the same as the number of skips stored in the skip number setting register 45. The transfer address and skip address comparator 47 sequentially compares the transfer address counted by the transfer address counter 46 with the individual skip addresses stored in the respective skip address registers. Every time a match occurs, an instruction on insertion of dummy data is transmitted to the dummy inserting section 49.

Upon receiving an instruction from the transfer address and skip address comparator 47, the dummy inserting section 49 inserts dummy data into the page data.

After the addition of the defect number information and the insertion of the dummy data have been carried out, the page data is transferred to the flash memory 3 and written in the corresponding page.

Now, with reference to FIG. 15, description will be given of a process procedure to read page data.

When page data is read from the flash memory 3, the skip number collation determining circuit 50 extracts the bit pattern added to the head of the page data as defect number information. The circuit 50 then determines through collation to which of Type "0", Type "1", Type "2", Type "3", and Type "4" this bit pattern corresponds. The circuit 50 also writes the number of skips corresponding to the determined type of the bit pattern, in the skip number register 51.

In connection with the page data transferred by the host, the transfer address counter 46 counts the corresponding column address (transfer address) starting with the head of the page data.

If the number of skips set in the skip number setting register 45 is at least 1, the transfer address and skip address comparator 47 uses skip address registers the number of which is the same as the number of skips stored in the skip number setting register 45.

The transfer address and skip address comparator 47 sequentially compares the transfer address counted by the transfer address counter 46 with the individual skip addresses stored in the respective skip address registers. Every time a match occurs, an instruction on extraction of dummy data is transmitted to the dummy extracting section 52.

Upon receiving an instruction from the transfer address and skip address comparator 47, the dummy extracting section 52 extracts dummy data from the page data.

After the extraction of the defect number information and the extraction of the dummy data have been carried out, the page data is transferred to the host via the ECC processing circuit 30.

Now, with reference to FIGS. 16 to 23, description will be given of the reason why the combination of bit patterns is excellent as defect number information and variations of the combination. In the bit pattern in each figure, each white square indicates the value "1", whereas each black square indicates the value "0".

Figure 16:
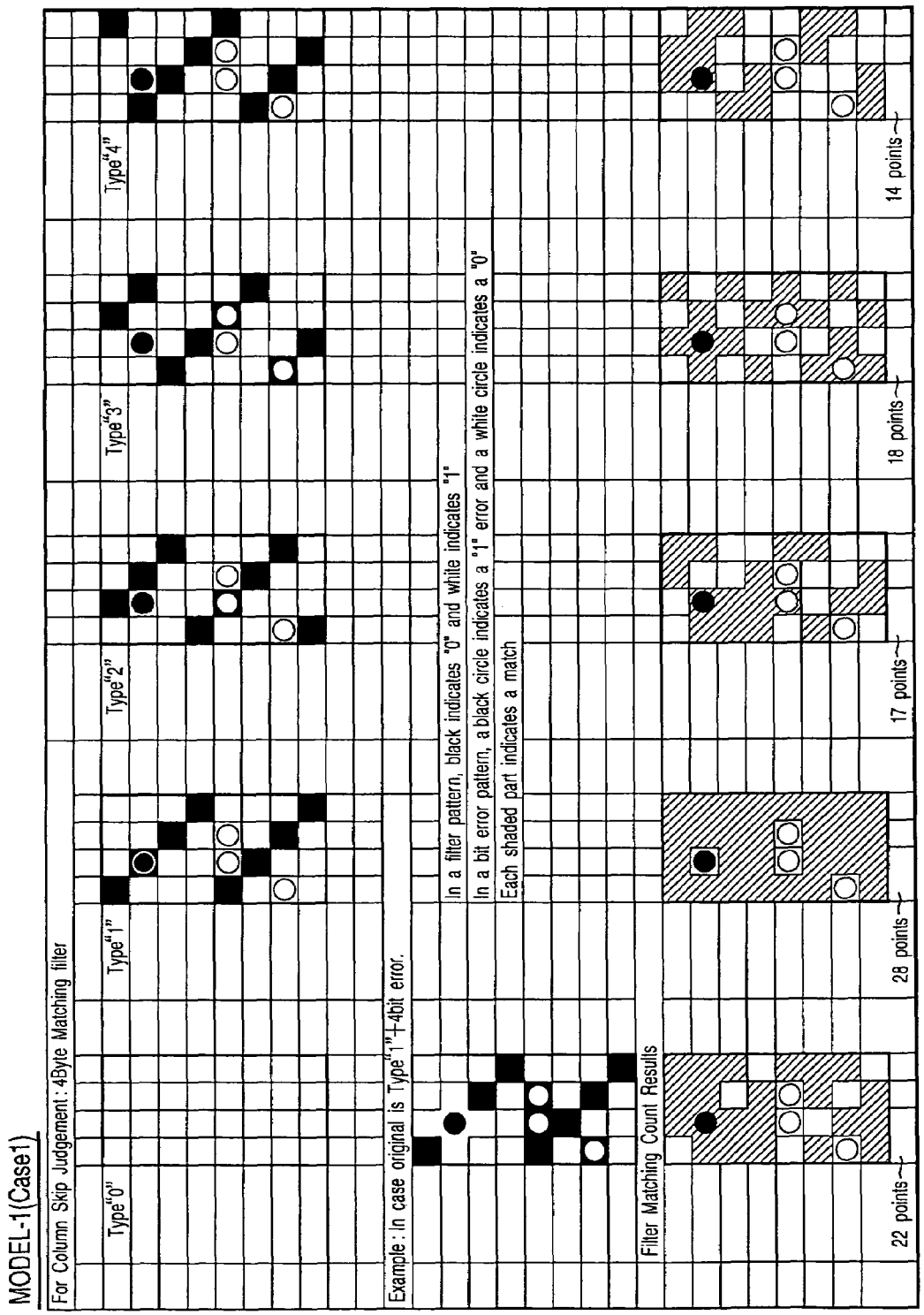
FIG. 16 is a diagram illustrating a case 1 in which a bit error occurs in a combination of bit patterns "MODEL-1"

FIG. 16 shows that if "MODEL-1" is employed as a combination of bit patterns, even if four bit errors occur in the bit pattern Type "1" added to the page data, the bit pattern Type "1" can be correctly determined (case 1).

The top stage in the figure shows the five types of bit patterns corresponding to "MODEL-1". The middle stage shows that the four bit errors have occurred in the bit pattern Type "1", so that the corresponding bit values have been reversed. In the figure, the black circle indicates the positions of bit errors with the value "1". The white circle indicates the positions of bit errors with the value "0". The bottom stage in the figure shows the results of collation of the erroneous bit pattern shown in the middle stage against each of the five types of bit patterns shown in the top stage. Each of the shaded parts in the figure indicates a bit for which the corresponding values in the two patterns are equal. Further, one bit for which the corresponding values in the two patterns are equal is counted as one point to calculate the score of each bit pattern. In this case, the bit pattern having the highest score is Type "1". It can thus be determined that the correct bit pattern corresponds to Type "1".

Figure 17:
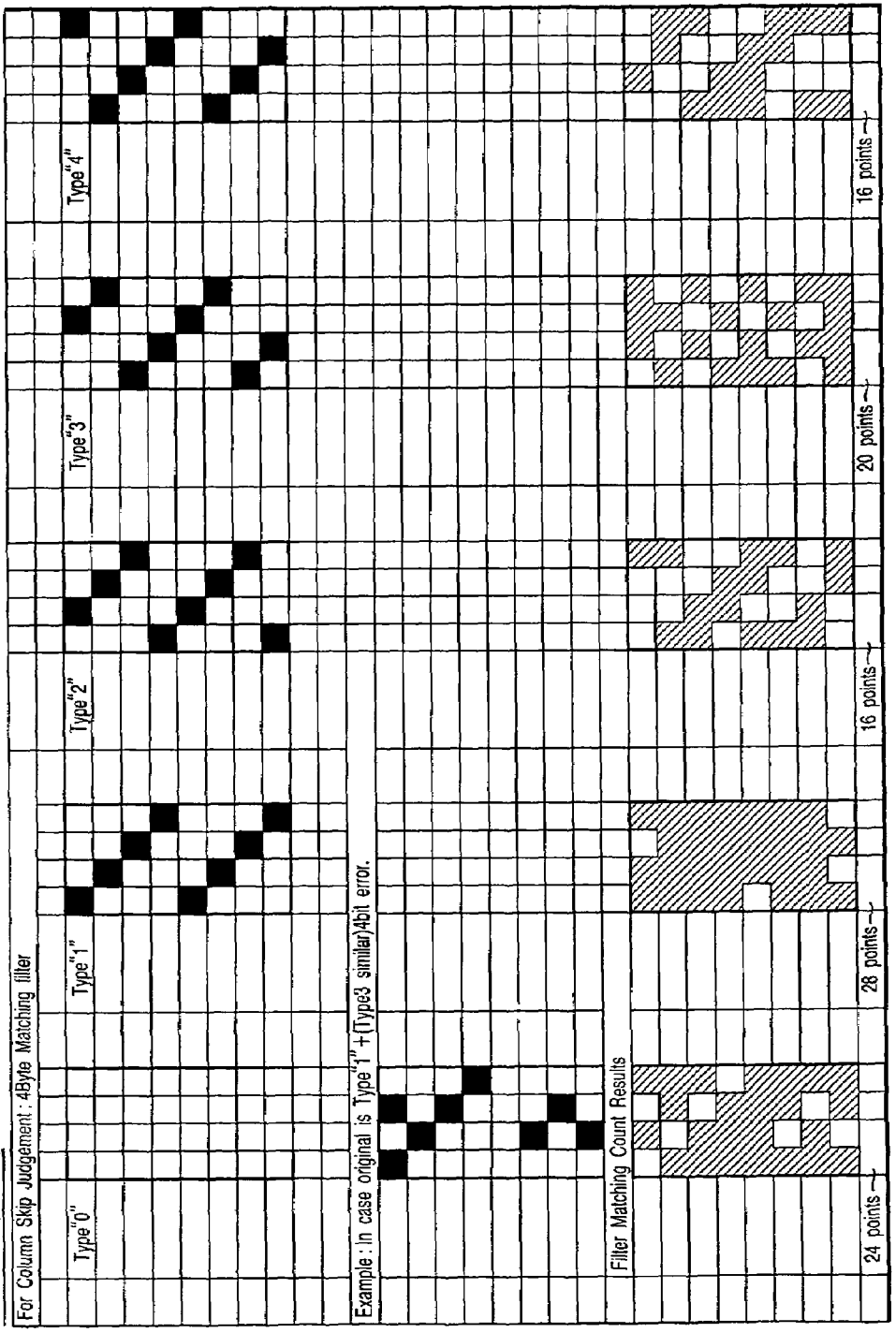
FIG. 17 is a diagram illustrating the case 2 in which a bit error occurs in the combination of bit patterns "MODEL-1"

FIG. 17 shows that if "MODEL-1" is employed as a combination of bit patterns, even if four bit errors (these errors make the bit values similar to those of Type "3") occur in the bit pattern Type "1" added to the page data, the bit pattern Type "1" can be correctly determined (case 2).

In this case, the middle stage shows that the four bit errors (these errors make the bit values similar to those of Type "3") have occurred in the bit pattern Type "1", so that the corresponding bit values have been reversed. Further, as shown in the bottom stage in the figure, the results of the collation show that the score of Type "1" is higher than the score of Type "3". After all, the bit pattern having the highest score is Type "1". It can thus be determined that the correct bit pattern corresponds to Type "1".

Figure 18:
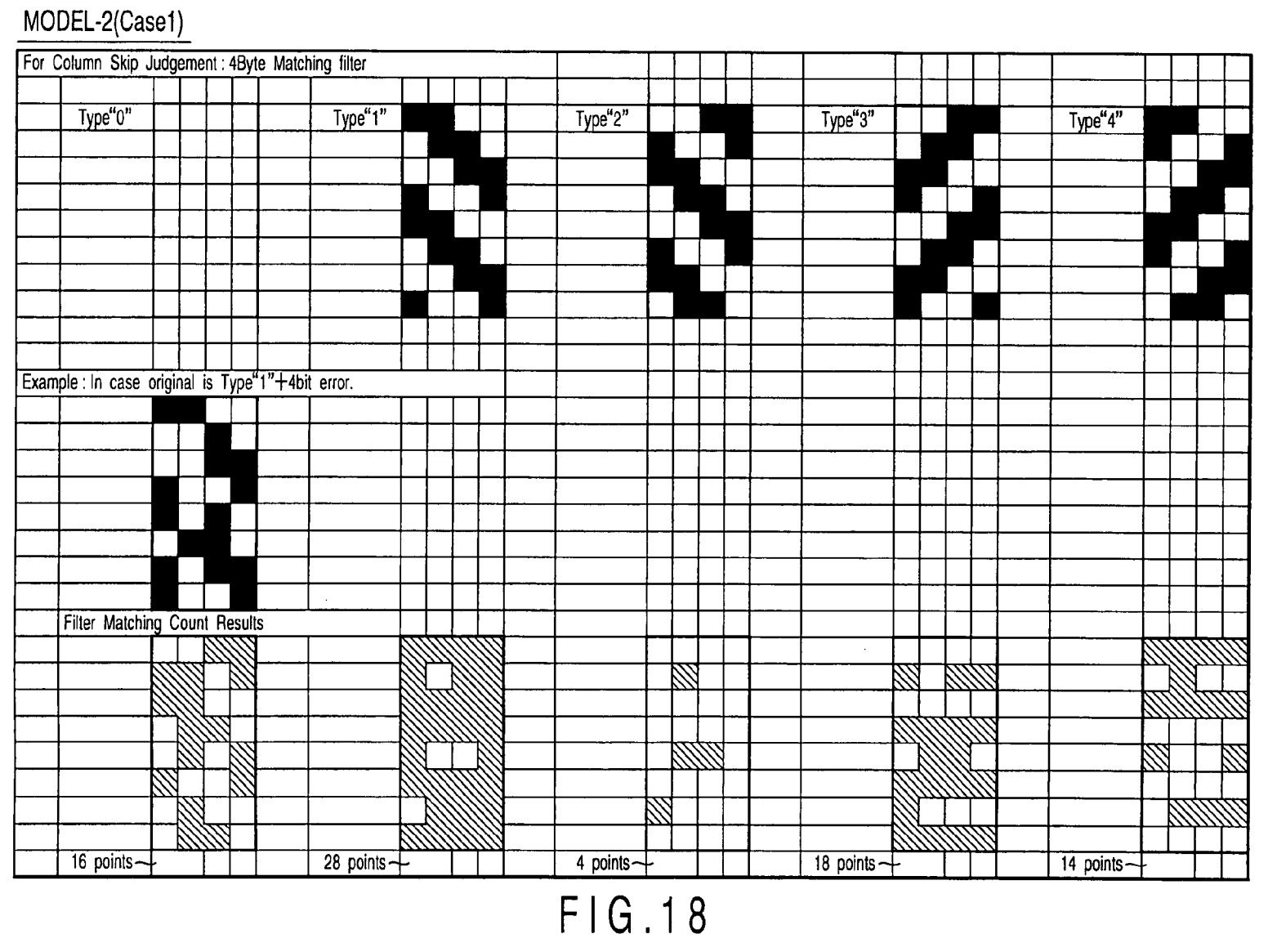

FIG. 18 shows that if "MODEL-2" is employed as a combination of bit patterns, even if four bit errors occur in the bit pattern Type "1" added to the page data, the bit pattern Type "1" can be correctly determined (case 1).

The top stage in the figure shows the five types of bit patterns corresponding to "MODEL-2". The middle stage shows that the four bit errors have occurred in the bit pattern Type "1", so that the corresponding bit values have been reversed. The bottom stage in the figure shows the results of collation of the erroneous bit pattern shown in the middle stage against each of the five types of bit patterns shown in the top stage. In this case, the bit pattern having the highest score is Type "1". It can thus be determined that the correct bit pattern corresponds to Type "1".

Figure 19:
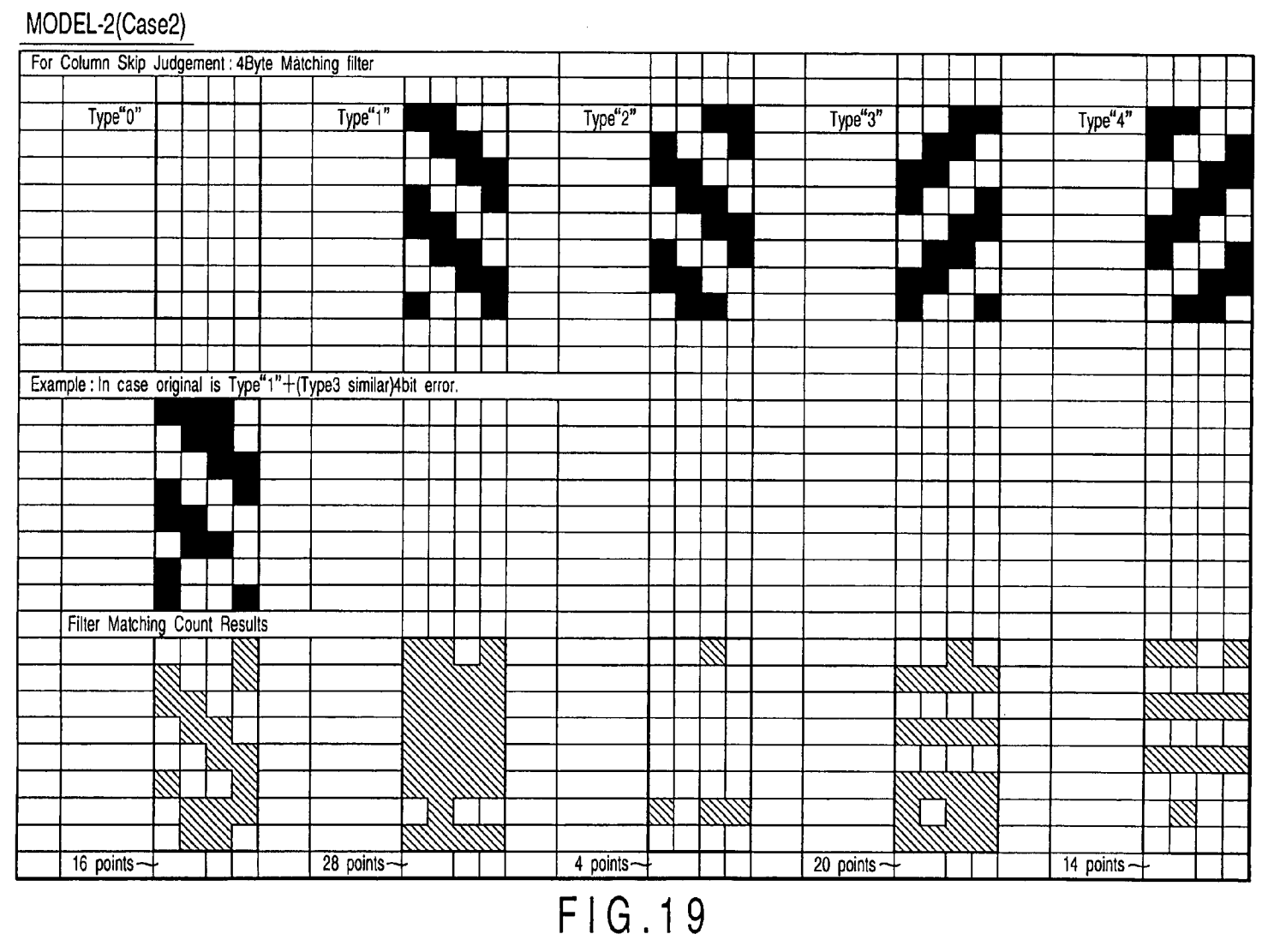

FIG. 19 shows that if "MODEL-2" is employed as a combination of bit patterns, even if four bit errors (these errors make the bit values similar to those of Type "3") occur in the bit pattern Type "1" added to the page data, the bit pattern Type "1" can be correctly determined (case 2).

In this case, the middle stage shows that the four bit errors (these errors make the bit values similar to those of Type "3") have occurred in the bit pattern Type "1", so that the corresponding bit values have been reversed. Further, as shown in the bottom stage in the figure, the results of the collation show that the score of Type "1" is higher than the score of Type "3". After all, the bit pattern having the highest score is Type "1". It can thus be determined that the correct bit pattern corresponds to Type "1".

Figure 20:
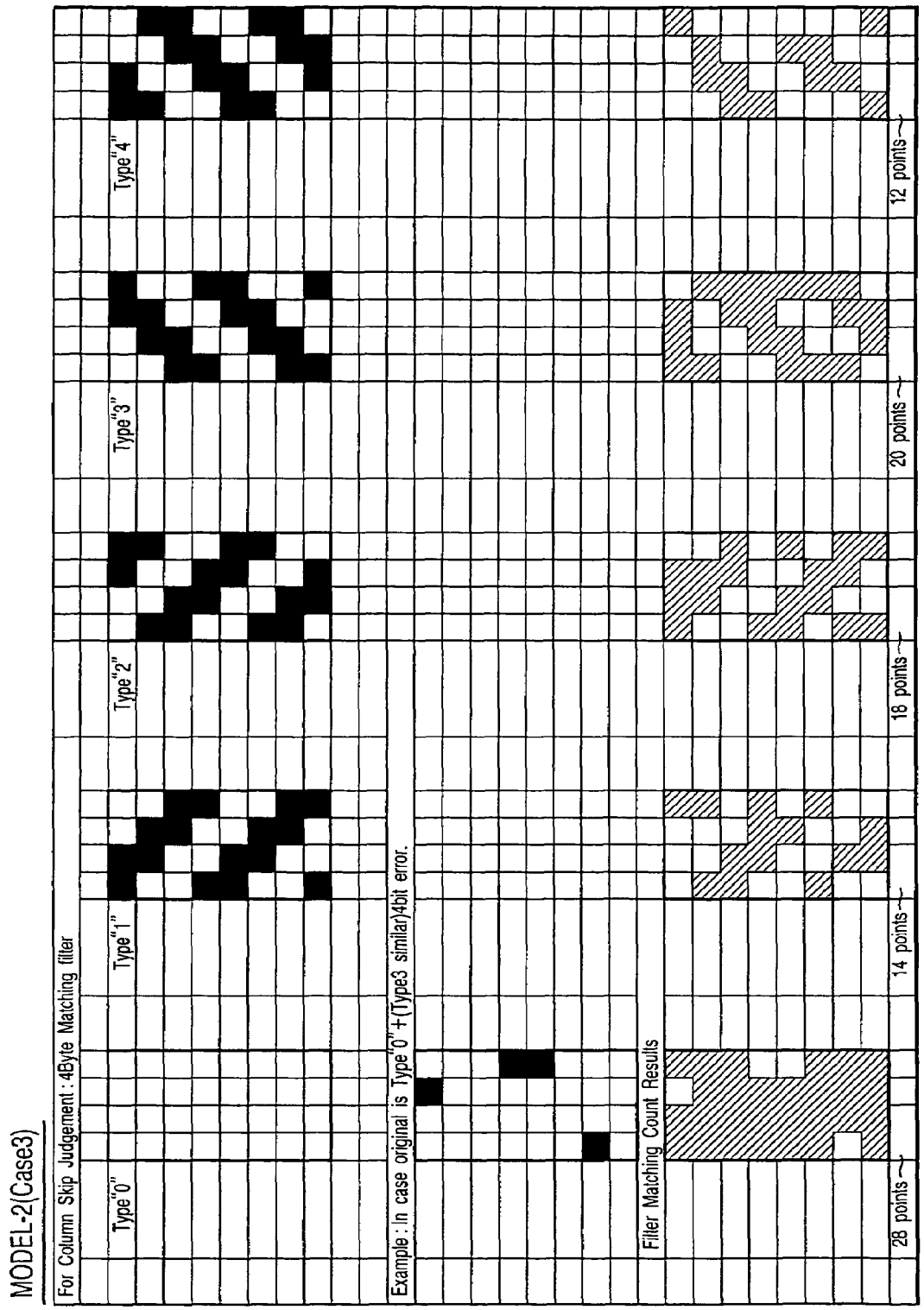
FIG. 20 is a diagram illustrating a case 3 in which a bit error occurs in the combination of bit patterns "MODEL-2"

FIG. 20 shows that if "MODEL-2" is employed as a combination of bit patterns, even if four bit errors (these errors make the bit values similar to those of Type "3") occur in the bit pattern Type "0" added to the page data, the bit pattern Type "0" can be correctly determined (case 3).

In this case, the middle stage shows that the four bit errors (these errors make the bit values similar to those of Type "3") have occurred in the bit pattern Type "0", so that the corresponding bit values have been reversed. Further, as shown in the bottom stage in the figure, the results of the collation show that the score of Type "0" is higher than the score of Type "3". After all, the bit pattern having the highest score is Type "0". It can thus be determined that the correct bit pattern corresponds to Type "0".

Figure 21:
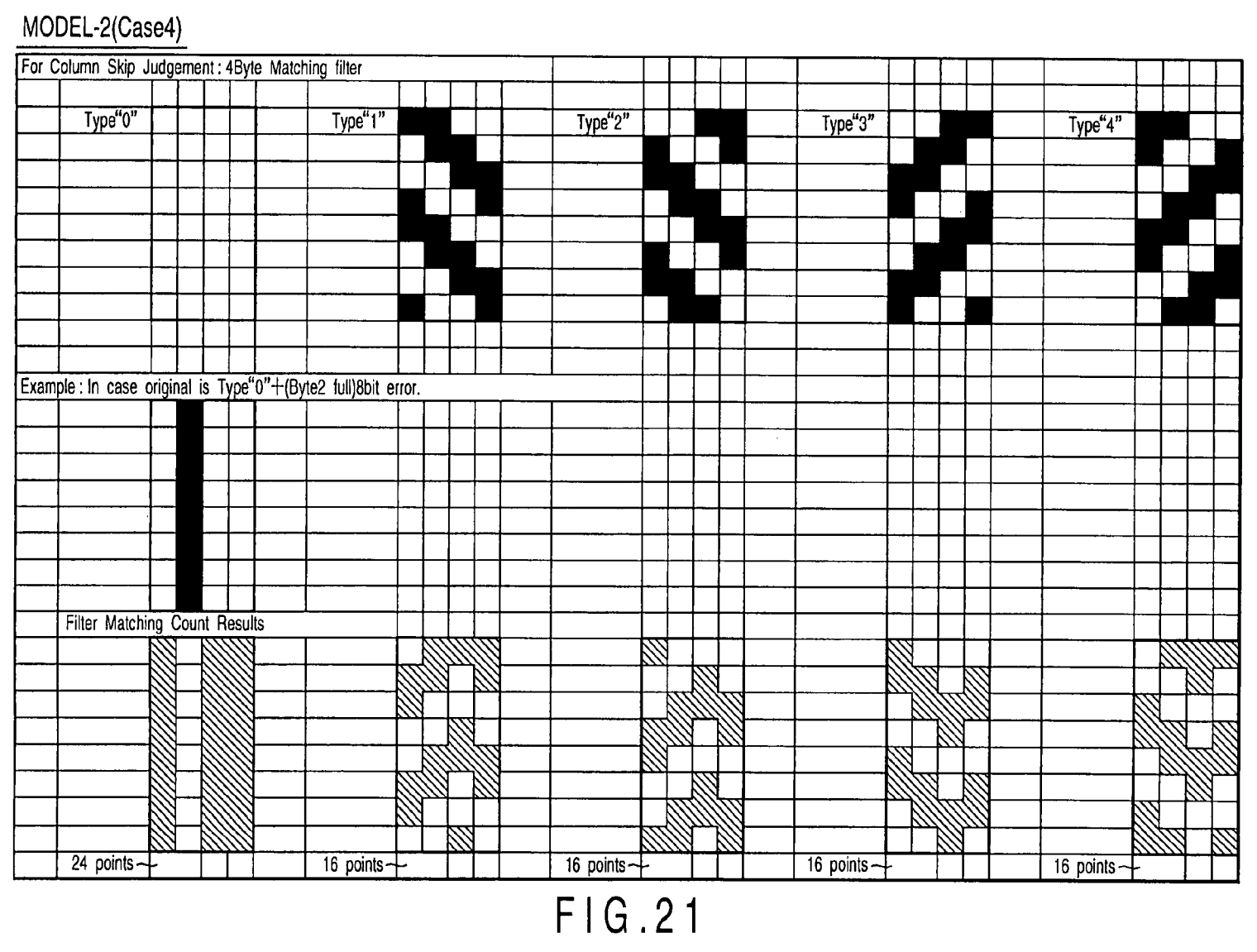

FIG. 21 shows that if "MODEL-2" is employed as a combination of bit patterns, even if eight unidirectional bit errors occur in the bit pattern Type "0" added to the page data, the bit pattern Type "0" can be correctly determined (case 4).

In this case, the middle stage shows that the eight unidirectional bit errors have occurred in the bit pattern Type "0", so that the corresponding bit values have been reversed. As shown in the bottom stage in the figure, the results of the collation show that the bit pattern having the highest score is Type "0". It can thus be determined that the correct bit pattern corresponds to Type "0".

Figure 22:
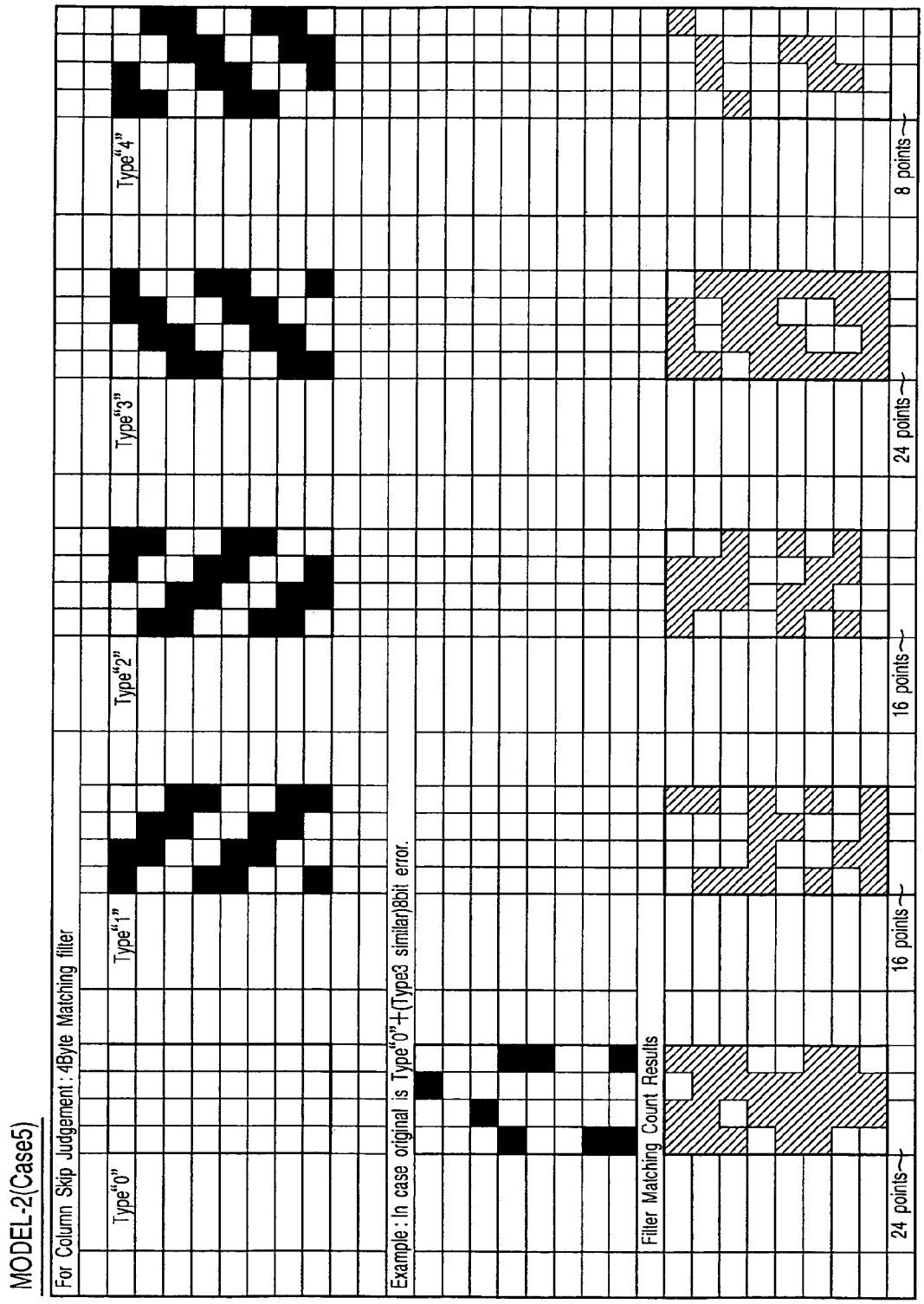
FIG. 22 is a diagram illustrating a case 5 in which a bit error occurs in the combination of bit patterns "MODEL-2"

FIG. 22 shows the case where when "MODEL-2" is employed as a combination of bit patterns, eight bit errors (these errors make the bit values similar to those of Type "3") occur in the bit pattern Type "0" (case 5).

In this case, the middle stage shows that the four bit errors have occurred in the bit pattern Type "0", so that the corresponding bit values have been reversed. As shown in the bottom stage in the figure, the results of the collation show that the bit pattern having the highest score is Type "0" and Type "3". Therefore, it is difficult to make determination when at least eight bit errors occur.

"MODEL-2", described above", is more excellent than "MODEL-1" in resistance to unidirectional errors and the ability to distinguish the bit patterns from each other on the basis of the matching score.

Figure 23:
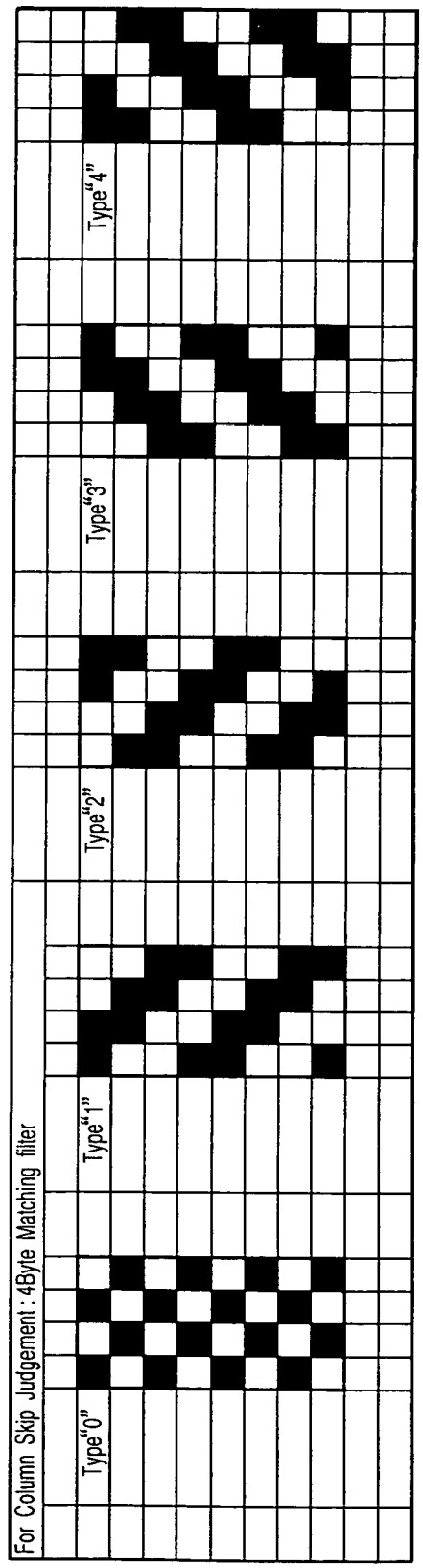
FIG. 23 is a diagram illustrating a combination of bit patterns "MODEL-3".

The combination of bit patterns in "MODEL-2", described above, may be varied to have the bit patterns in "MODEL-3", shown in FIG. 23 (that is, the bit pattern Type "0" may be changed). The employment of "MODEL-3" makes it possible to enhance the resistance to unidirectional bit errors in Type "0" compared to "MODEL-2". For example, if unidirectional bit errors occur as shown in the case 4 in FIG. 21, Type "0" has a score of 24 with "MODEL-2" and a higher score of 28 with "MODEL-3".

As described above, according to the above embodiment, for a page data write, if there is any defective column, an increase in error rate can be suppressed by inserting dummy data into the corresponding position and executing a skip process. Further, such a process prevents the write verify function from executing an unwanted loop process in order to verify written data. This in turn prevents the degradation of performance of the whole memory.

Furthermore, in the above embodiment, by adding defect number information to page data for a page data write, it is possible to reference the defect number information for a page data read. Accordingly, a required number of dummy data can be correctly extracted, thus providing page data with a reduced error rate. This makes it possible to reduce the load of the ECC process.

Furthermore, in the above embodiment, the reliability of defect number information can be improved by providing plural types of bit patterns corresponding to the number of defective columns and configuring the bit patterns so that each bit pattern can be distinguished from the others even though errors occur in a certain number of bits of the plurality of bits constituting that bit pattern.

Furthermore, in the above embodiment, the erase block size of the flash memory 3 actually used is larger than that of the flash memory assumed by the host 20. However, of course, the erase block size of the flash memory 3 actually used may be the same as that of the flash memory assumed by the host 20.

Furthermore, in the above embodiment, the NAND flash memory is described as an example of the nonvolatile memory. However, the nonvolatile memory is not limited to the NAND flash memory but other types of memories are applicable.

As described above in detail, the present invention can prevent the degradation of process performance caused by column defects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
an interface which executes an interfacing process with a semiconductor memory; and
a circuit which is provided in the interface and which performs a column skip processing on serial data having a format containing a reserved area in an end of the format by skipping a position corresponding to a defective column on the semiconductor memory and that transfers the serial data to the semiconductor memory in a write operation, succeeding data after the skipping being written to positions of columns shifted backward by an amount of the defective column,
wherein in the write operation, the circuit inserts particular data operating as a dummy into a position, which corresponds to the defective column, in the serial data and then transfers the serial data to the semiconductor memory.

2. A semiconductor device comprising:
an interface which executes an interfacing process with a semiconductor memory; and
a circuit which is provided in the interface and which performs a column skip processing on serial data having a format containing a reserved area in an end of the format by skipping a position corresponding to a defective column on the semiconductor memory and that transfers the serial data to the semiconductor memory in a write operation, succeeding data after the skipping being written to positions of columns shifted backward by an amount of the defective column,
wherein in the write operation, the circuit adds defect number information indicative of the number of defective columns in an area in which the serial data is to be written and then transfers the serial data to the semiconductor memory.

3. The semiconductor device according to claim 2, wherein the circuit has plural types of bit patterns corresponding to the number of defective columns, as the defect number information, and
each bit pattern is made up of a plurality of bits to be distinguished from the others even if that bit pattern has errors in a certain number of bits.

4. The semiconductor device according to claim 2, wherein in a read operation, the circuit extracts the defect number information which has been added to the serial data from the serial data read from the semiconductor memory, refers to the defect number information, extracts particular data the number of which is shown in the defect number information and which have been inserted into the serial data, and then transfers the serial data.

5. A memory card comprising:
a nonvolatile semiconductor memory; and
a controller which performs a column skip processing on serial data having a format containing a reserved area in an end of the format by skipping a position corresponding to a defective column on the nonvolatile semiconductor memory and that transfers the serial data to the semiconductor memory in a write operation, succeeding data after the skipping being written to positions of columns shifted backward by an amount of the defective column,
wherein in the write operation, the controller inserts particular data operating as a dummy into a position, which corresponds to the defective column, in the serial data and then transfers the serial data to the semiconductor memory.

6. The memory card according to claim 5, wherein in the write operation, the controller adds defect number information indicative of the number of defective columns in an area in which the serial data is to be written and then transfers the serial data to the semiconductor memory.

7. The memory card according to claim 6, wherein the controller has plural types of bit patterns corresponding to the number of defective columns, as the defect number information, and
each bit pattern is made up of a plurality of bits to be distinguished from the others even if that bit pattern has errors in a certain number of bits.

8. The memory card according to claim 6, wherein in a read operation, the circuit extracts the defect number information which has been added to the serial data from the serial data read from the semiconductor memory, refers to the defect number information, extracts particular data the number of which is shown in the defect number information and which have been inserted into the serial data, and then transfers the serial data.

9. The memory card according to claim 5, wherein the nonvolatile semiconductor memory is a NAND flash memory.

* * * * *